(12) United States Patent
Jones et al.

(10) Patent No.: US 6,329,226 B1
(45) Date of Patent: Dec. 11, 2001

(54) METHOD FOR FABRICATING A THIN-FILM TRANSISTOR

(75) Inventors: Christopher D. W. Jones, New Providence; Donald W. Murphy, Green Brook; John A. Rogers, New Providence, all of NJ (US); Jennifer Tate, Columbus, OH (US); Richart E. Slusher, Lebanon, NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/585,159

(22) Filed: Jun. 1, 2000

(51) Int. Cl.[7] .............................. H01L 21/00; H01L 21/84
(52) U.S. Cl. ........................ 438/151; 438/149; 438/154
(58) Field of Search ................................. 438/142, 149, 438/151, 154

(56) References Cited

U.S. PATENT DOCUMENTS 5,981,970 * 11/1999 Dimitrakopoulos et al. .......... 257/40
6,150,191 * 11/2000 Bao ........................................ 438/99
6,157,127 * 12/2000 Hosokawa et al. ................... 313/506

OTHER PUBLICATIONS

Van Zant, Peter "Microchip Fabrication—A Practical Guide to Semiconductor Processing" Mcgraw–Hill, Fourth edition, p 188.*

* cited by examiner

Primary Examiner—Richard Elms
Assistant Examiner—Bradley Smith
(74) Attorney, Agent, or Firm—Baker & McKenzie

(57) ABSTRACT

A method for fabricating a thin-film field effect transistor such as a thin-film field effect transistor. The method includes preparing a gate electrode on a substrate, anodizing at least a portion of the gate electrode to form a gate dielectric, and fabricating an electrically conducting source electrode and a drain electrode on the gate dielectric. The method also includes depositing an organic semiconductor on at least a portion of the gate dielectric, the source electrode and the drain electrode.

10 Claims, 10 Drawing Sheets

METHOD FOR FABRICATING A THIN-FILM TRANSISTOR

FIELD OF THE INVENTION

The present invention relates to the field of thin-film transistors, in particular the field of fabricating an organic thin-film field effect transistor.

BACKGROUND INFORMATION

Techniques for fabricating and patterning transistors include photochemical patterning, for example, to construct source/drain electrodes and appropriate interconnections for functional organic circuits. Such methods, however, may have the processing disadvantage of relying on vacuum evaporated conductors for source, drain and thin dielectric layers. Although it is possible to produce low voltage (~5 V) transistors with thin gate dielectrics of $SiO_2$ (~100 nm) by combining printing and low cost near-field photolithographic methods, solution processed dielectrics typically include thick (~1 μm) spin cast or screen printed polymer films. Accordingly, the low capacitance of these layers restricts operation to voltages (~100 V) that may exceed voltages required for many applications.

High capacitance gate dielectrics of barium zirconate titanate formed by radio frequency magnetron sputtering have been successfully used for organic p-channel transistors, however, opportunities remain for convenient procedures for fabricating thin, low defect (pinhole-free) gate dielectrics of more conventional and easily processible materials. A need exists for fabricating transistors that incorporate an organic semiconductor and that can operate at low voltages, including anodization for thin (~50 nm), high capacitance gate dielectrics, and microcontact printing on electroless silver for high resolution (~1 μm) source/drain electrodes.

SUMMARY OF THE INVENTION

An aspect of the present invention provides a method for fabricating a thin-film transistor. The method includes preparing a gate electrode on a substrate, anodizing at least a portion of the gate electrode to form a gate dielectric, and fabricating an electrically conducting source electrode and a drain electrode on the gate dielectric. The method also includes depositing an organic semiconductor on at least a portion of the gate dielectric, the source electrode and the drain electrode.

Another aspect of the present invention provides a method for fabricating a thin-film transistor. The method includes preparing a gate electrode on a substrate, anodizing at least a portion of the gate electrode to form a gate dielectric and depositing an organic semiconductor on at least a portion of the gate dielectric. The method also includes fabricating an electrically conducting source electrode and a drain electrode on the organic semiconductor.

DETAILED DESCRIPTION

The present invention relates to a solution-based, low temperature fabrication process of an organic, thin-film transistor (TFT) 100 such as a thin-film field effect transistor. Organic electronic systems are beneficial, in part, because active materials such as semiconductors and light emitters can be deposited with techniques (e.g. spin coating, solution casting, printing, etc.) that are much simpler and cheaper than conventional techniques used for silicon microelectronics. Organic TFTs 100 can also be easily integrated with substrates 110 such as flexible plastic substrates and allow new types of devices such as electronic paper and re-usable luggage tags.

Figure 1:
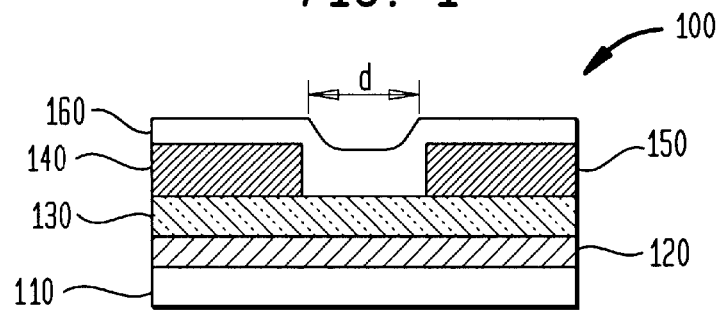
FIG. 1 shows a cross-section schematic illustration of a thin-film field effect transistor fabricated by an exemplary embodiment of the present invention illustrated in FIG. 2.

The thin-film transistor 100 as shown in FIG. 1 fabricated by an exemplary embodiment of the present invention includes a substrate 110, a gate electrode 120, a gate dielectric 130, high-resolution source/drain electrodes 140, 150, and an organic semiconductor 160. The gate electrode 120 is anodized to form a thin gate dielectric 130 having a reduced amount of pinholes, for example, than the amount of pinholes of a gate dielectric formed by spin casting or printing.

In an exemplary embodiment of the present invention, the geometries and characteristics of the source/drain electrodes 140, 150 and the gate dielectrics 130 of an organic transistor 100 determine the electrical properties of the TFTs 100. Performance and size requirements of transistors for many types of low voltage (<10 V), high resolution displays, for example, can be satisfied with organic semiconductors if the source/drain electrodes 140, 150 are separated by, for example, less than ~25 μm, and the gate dielectrics have capacitances greater than ~75 $nF/cm^2$.

Figure 2:
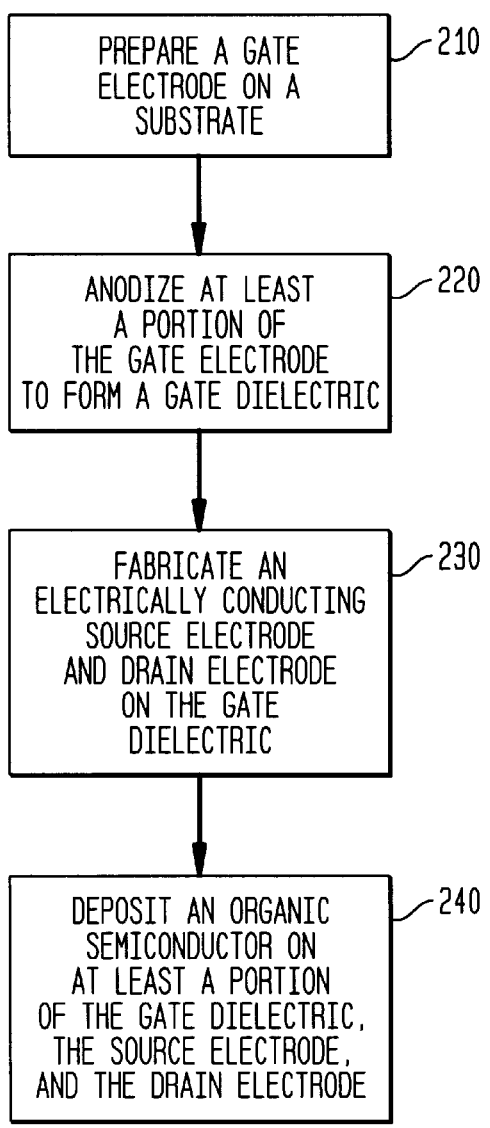
FIG. 2 shows an exemplary embodiment of a fabrication process of the present invention for forming a thin-film transistor (TFT).
Figure 12A:
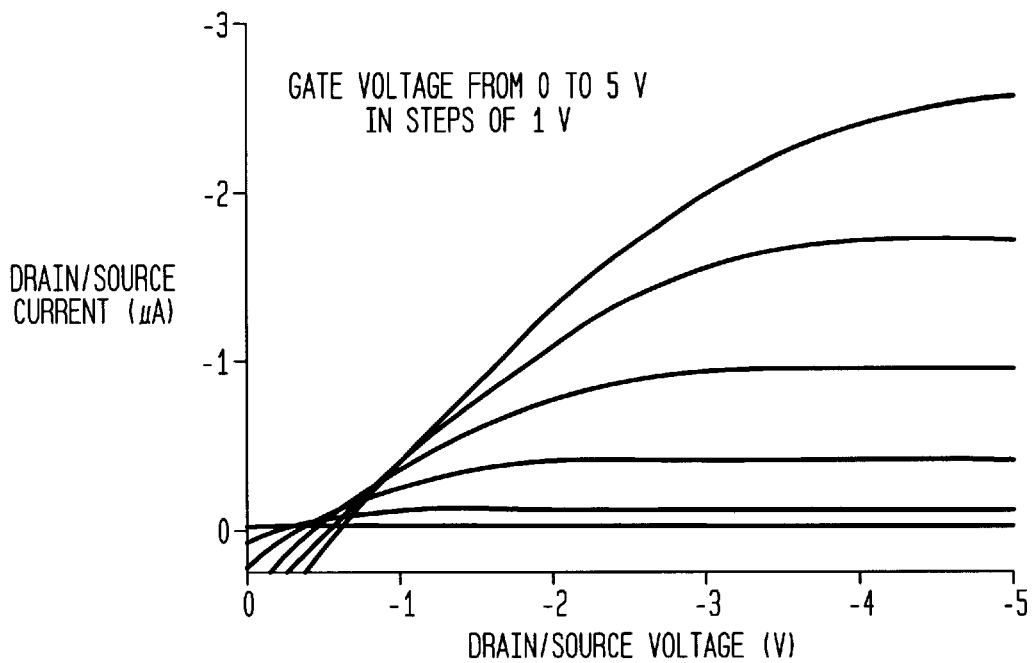
FIGS. 12a and 12b show a p-channel organic transistor in a normal and bent state.
Figure 12B:
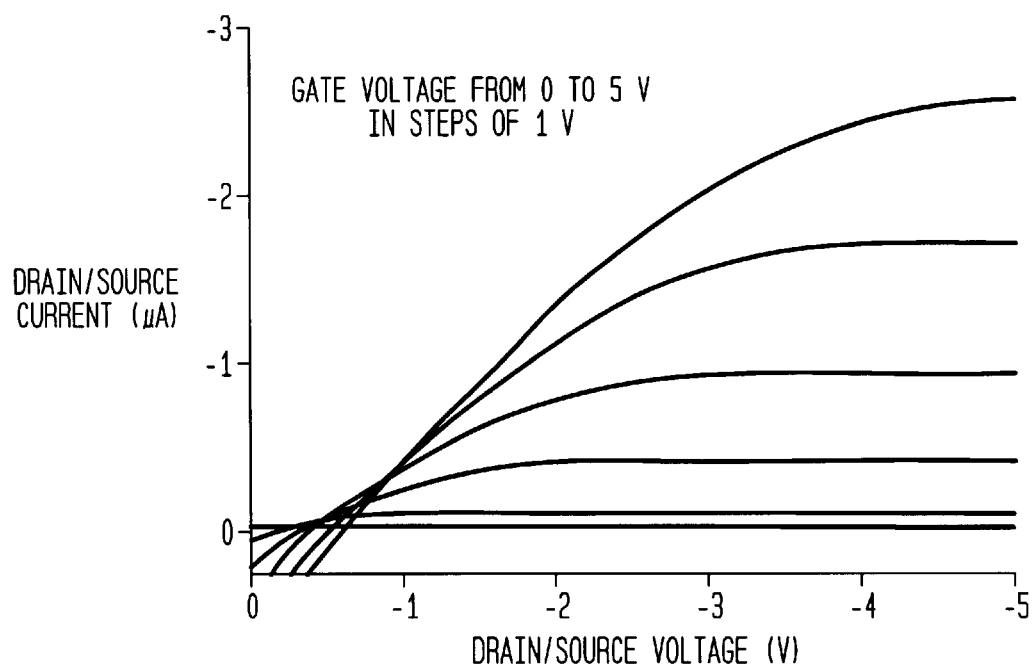

FIG. 2 illustrates an exemplary embodiment of a fabrication process of a thin-film transistor 100 of the present invention. In 210, a gate electrode 120 is prepared on a substrate 110. The substrate 110 may be a flexible substrate such as plastic (e.g., mylar, kapton) and a thin sheet glass. A flexible substrate allows, for example, the device to be rugged. FIG. 12a and 12b, for example, show electrical characteristics of a p-channel organic transistor having an approximately 50 micron thickness thin sheet of glass in a normal state (FIG. 12a) and bent state (FIG. 12b). In an exemplary embodiment of the present invention, the gate electrode may be Ta, and approximately 140 nm thick.

Figure 3:
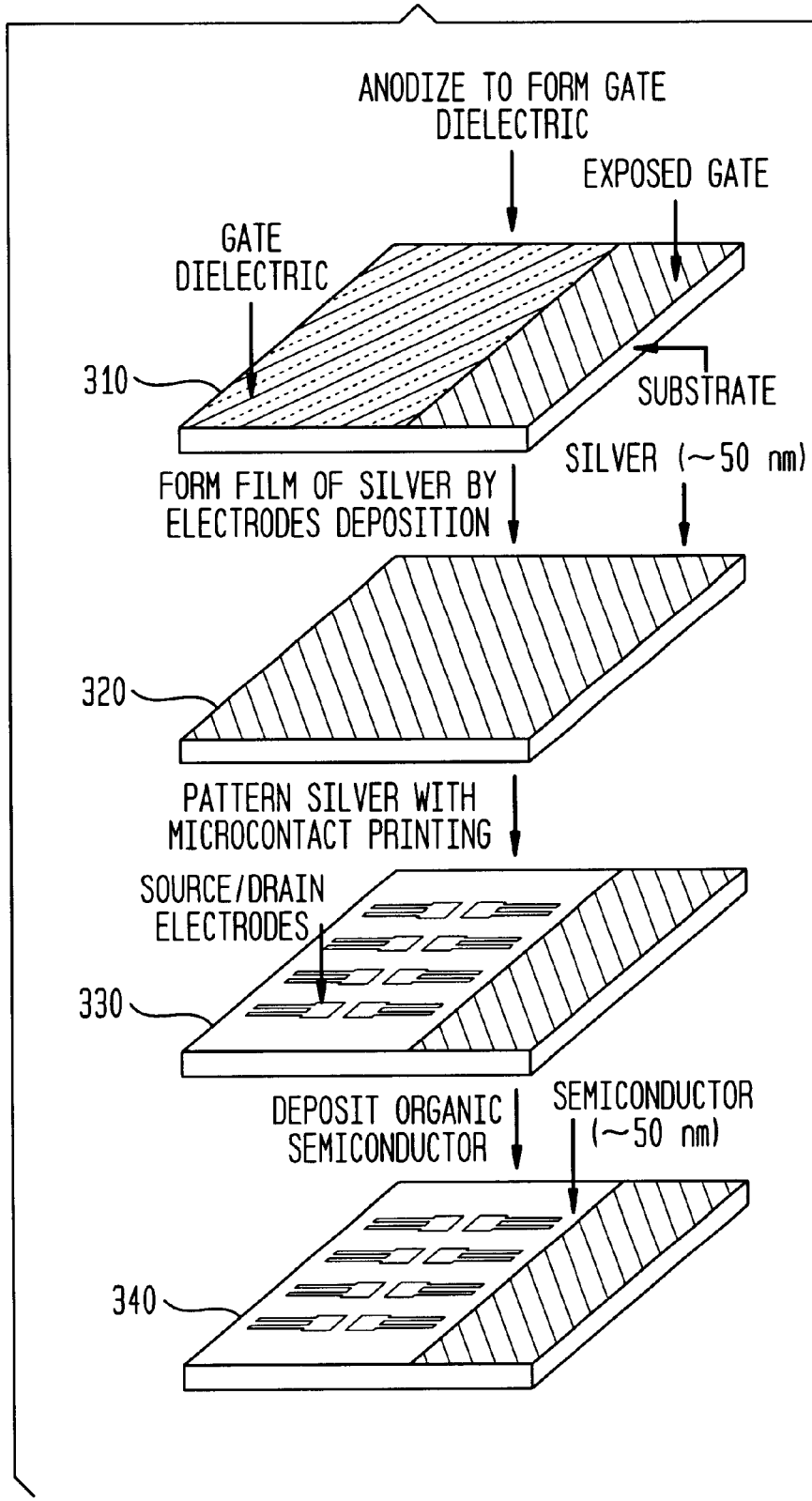
FIG. 3 shows an exemplary embodiment of a fabrication process of the present invention for forming a TFT.

In 220, at least a portion of the gate electrode 120 is anodized to form a gate dielectric 130, for example, as shown in 310 of FIG. 3. Anodization defines an oxide layer having a typical thickness of approximately 20–300 nm on a conducting film or substrate. Materials that can be anodized to form dielectric layers include, for example, Si, Al, Ti, Zr, Hf, V, Nb, Ta, Mo, W and alloys comprised primarily of these elements. In an exemplary embodiment of the present invention, the metal layer may include at least one of Ti, Zr, Hf, Nb, Ta, Al, and doped Si. The resultant gate dielectric may be pure oxides such as $TiO_2$, $ZrO_2$, $HfO_2$, $Nb_2O_5$, $Ta_2O_5$, $Al_2O_3$ and $SiO_2$, respectively. In a exemplary embodiment of the present invention, the dielectic may be $Ta_2O_5$ and approximately 60 nm thick. The conformal nature of the anodic oxides should be particularly important for forming electrically insulating coatings on metal films that are deposited on rough, low cost plastics. Further, with optimized conditions for anodization, forming oxides with low porosities are possible. These types of oxides are non-brittle, provide a smooth surface for formation of the semiconductor film, and are generally easier to work with than porous oxides.

The gate dielectric 130 should be compatible with the organic semiconductor 160. Accordingly, the anodization conditions used to form the anodic oxide and the respective anodic oxide used for application with organic semiconductors 160 should include desirable characteristics. The desirable characteristics may include dielectric constants that are high compared to most organic materials; low cost, low temperature fabrication; growth-based synthesis that forms conformal, defect-free insulating coatings on the underlying conductor which is typically used as the gate of the transistor; low leakage; low porosity; low surface roughness; surface free energies that allow the semiconductor to wet adequately the surface of the oxide; suitable surface interactions that lead to sufficient ordering of the semiconductor molecules; low density of traps for carriers at the interface between the semiconductor and the oxide; compatibility (adhesion, etc.) with polymeric, electrolessly deposited or other types of conducting materials that can be used in organic systems and can be deposited and patterned at low cost; and low levels of chemical dopants whose presence can increase the off currents in organic transistors.

Table 1 below illustrates the dielectric constants, leakage and porosity characteristics of pure oxides that can be formed by anodization.

TABLE 1

| Oxide | Dielectric constant (typically ± 20%) | Leakage | Possible Porous Oxide |
|---|---|---|---|
| $SiO_2$ | 4 | Varies | Yes |
| $Al_2O_3$ | 10 | Can be made low but requires specific synthetic conditions | Yes |
| $TiO_2$ | 12–114 | High | No |
| $ZrO_2$ | 22 | Low | No |
| $HfO_2$ | 18 | Low | No |
| $Nb_2O_5$ | 40 | High | No |
| $Ta_2O_5$ | 24 | Low | No |

Desirable characteristics of anodic oxides for applications in thin-film transistors 100 on flexible substrates include thickness below approximately 1 micron to avoid fracture when the film is bent; good adhesion of the oxide to the underlying metal; low temperature processing conditions that are compatible with plastic substrates; good adhesion of the anodized metal to the underlying flexible substrate; fracture toughness or high maximum strain before fracture; and growth-based synthesis that forms conformal, defect-free insulating coatings on conductors that are deposited on rough, low cost plastic substrates.

In 230, an electrically conducting source electrode 140 and a drain electrode 150 is fabricated on the gate dielectric 130. In an exemplary embodiment of the present invention, the source 140 and drain 150 may be Ag. The source 140 and drain 150 may be spaced apart by a distance d. In an exemplary embodiment of the present invention, the distance d may be approximately equal to 1 $\mu$m. In an exemplary embodiment of the present invention, fabricating the electrically conducting source electrode 140 and the drain electrode 150 on the gate dielectric 130 may include as shown in 320 of FIG. 3 forming a film of silver on at least one of the gate dielectric 130 and organic semiconductor 160, for example, by electroless deposition and as shown in 330 of FIG. 3 patterning the film of silver, for example, with microcontact printing. Microcontact printing forms, for example, a patterned self-assembled monolayer (SAM) on a uniform layer of electroless silver deposited onto the oxide. Wet chemical etching of the unprinted regions of the silver, followed by removal of the SAM with mild heating forms the source/drain electrodes 140, 150. In an exemplary embodiment of the present invention, the film of silver and the resulting source electrode 140 and drain electrode 150 may be, for example, 50 nm thick as shown in 320. In an exemplary embodiment of the present invention, the semiconductor 160 may be, for example, approximately 50 nm thick as shown in 340.

In 240 an organic semiconductor 160 is deposited on at least a portion of the gate dielectric 130, the source electrode 140 and the drain electrode 150. In an exemplary embodiment of the present invention, the organic semiconductor may be dihexyl quinquethiophene (DHα5T) and approximately 50 nm thick.

In an exemplary embodiment of the present invention, the method of fabricating a TFT includes anodizing at least one of Ta and Si as they are compatible with certain organic semiconductors. Tantalum oxide has a high dielectric constant ($\epsilon \sim 23$) and can be fabricated with low electrical leakage ($<10^{-8}$ $A/cm^2$ at 1 MV/cm). Anodized silicon may enable easy monolithic integration of organic systems with conventional microelectronics.

In an exemplary embodiment of the present invention, the method of fabricating a TFT includes microcontact printing with electroless (Tollens) silver to fabricate high resolution (~1 $\mu$m) source/drain electrodes on both of these types of anodized substrates. Bottom contact n and p-channel transistors formed with these components show good performance at low voltages. In an exemplary embodiment of the present invention, the separation between the source and drain electrodes was ~15 $\mu$m, and the lengths of their sides may be, for example, varied between 1600 and 100 $\mu$m.

Figure 4:
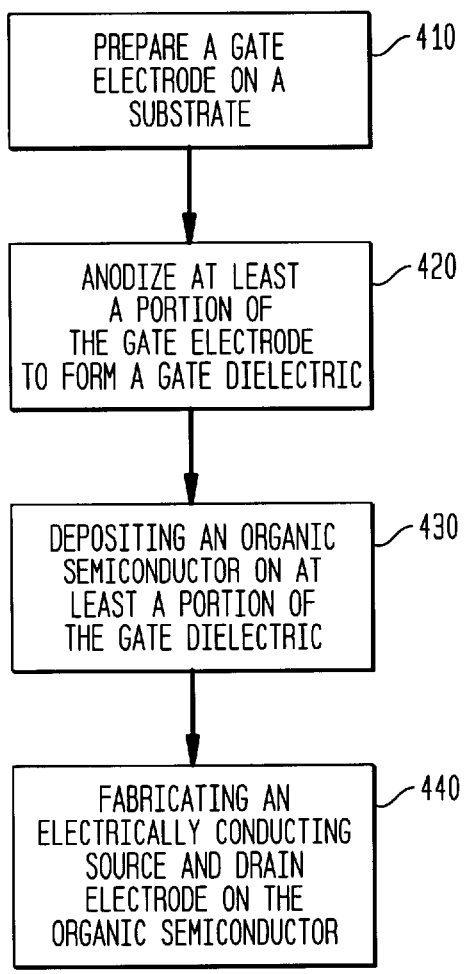
FIG. 4 shows another exemplary embodiment of a fabrication process of the present invention for forming a TFT.
Figure 5:
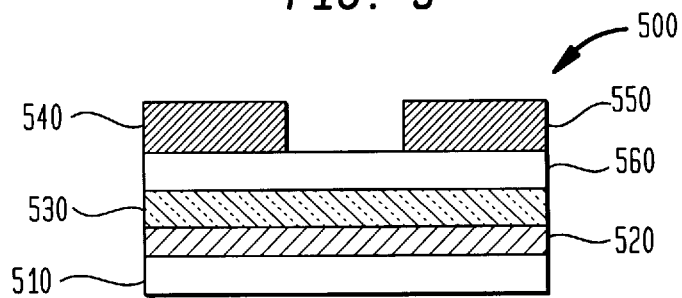
FIG. 5 shows a cross-section illustration of a TFT fabricated by an exemplary embodiment of the present invention illustrated in FIG. 4.

FIG. 4 illustrates an exemplary embodiment of a fabrication process of a TFT 500 (FIG. 5) of the present invention. In 410, a gate electrode 520 is prepared on a substrate 510. The substrate 510 may be a flexible substrate such as plastic. In 520, at least a portion of the gate electrode 520 is anodized to form a gate dielectric 530. As previously mentioned with respect to FIG. 2, the gate dielectric 530 should be compatible with the organic semiconductor 560. In 430 an organic semiconductor 560 is deposited on at least a portion of the gate dielectric 530. In 440, an electrically conducting source electrode 540 and a drain electrode 550 is fabricated on the semiconductor 560.

Below are provided detailed examples of the present invention.

EXAMPLES

Preparing the Gate Electrode and Gate Dielectric

In an exemplary embodiment of the present invention, transistors of the present invention were fabricated using three dielectric/gate materials: (i) thermally grown $SiO_2$ on a highly doped silicon substrate (n-type, $\rho=0.02–1.0$ Ωcm, Silrec Corp.; wherein p is resistivity), (ii) anodically grown $Ta_2O_5$ on sputtered tantalum on silicon and (iii) anodically grown $SiO_2$ on highly doped silicon. The transistors with thermal $SiO_2$, were constructed to establish the utility of microcontact printing on electroless silver for fabricating the source and drain electrodes. Microcontact printing with electroless silver deposited onto the anodized dielectrics yielded transistors having a comparable performance to devices that use thermal $SiO_2$.

In an exemplary embodiment of the present invention, anodized $Ta_2O_5$ was made from approximately 200 nm tantalum films sputter deposited on silicon (100) wafers. The anodization was performed in 0.01 M citric acid (Aldrich, 99.5+%) solution with a platinum foil counter electrode (negative electrode). The wafer sections were only partially submersed in the solution; electrical contact was made to the submersed section with a gold-coated copper clip (positive electrode). A constant current (~0.2 mA/cm$^2$) was applied to the samples until the desired voltage (~35 V) was reached. The samples were held at the final voltage for several hours before being removed from the bath, rinsed and dried with compressed air. The thickness of the $Ta_2O_5$ layer is linearly related to the final anodization voltage with a proportionality constant of ~2 nm/V at room temperature. This constant corresponds well to the observed breakdown field of ~5 MV/cm. The thickness of the $Ta_2O_5$ layer and its refractive index were measured with an ellipsometer (AutoEL, Rudolph Research) at 633 nm, assuming zero extinction. The measured indices of refraction were 2.15±0.05.

In an exemplary embodiment of the present invention, anodized $SiO_2$ was formed on highly doped p-type (boron) silicon (100) wafers ($\rho=0.006–0.01$ Ωcm). To obtain a thick $SiO_2$ layer, anodization was performed at 85° C. in 0.01 M citric acid solution with a platinum foil counter electrode. A constant current (~0.3 mA/cm$^2$) was applied to the sample for the duration of the anodization (75 min) with the final voltage reaching 42 V. The thickness of the $SiO_2$ was measured with a surface profiler (Dektak$^3$ST, Veeco/Sloan Technology) to be 270±20 nm. Ellipsometry at 633 nm assuming zero extinction gave a thickness of 280±15 nm with a refractive index of 1.43±0.04. A thinner anodized $SiO_2$ layer was formed by anodizing at room temperature with a constant current (~0.2 mA/cm$^2$) for 135 min. The final voltage was approximately 30 V. The thickness and index of refraction were measured by ellipsometry to be 60±3 nm and 1.40±0.04 respectively.

Testing of the Gate Dielectric Electrical Characteristics

Figure 8A:
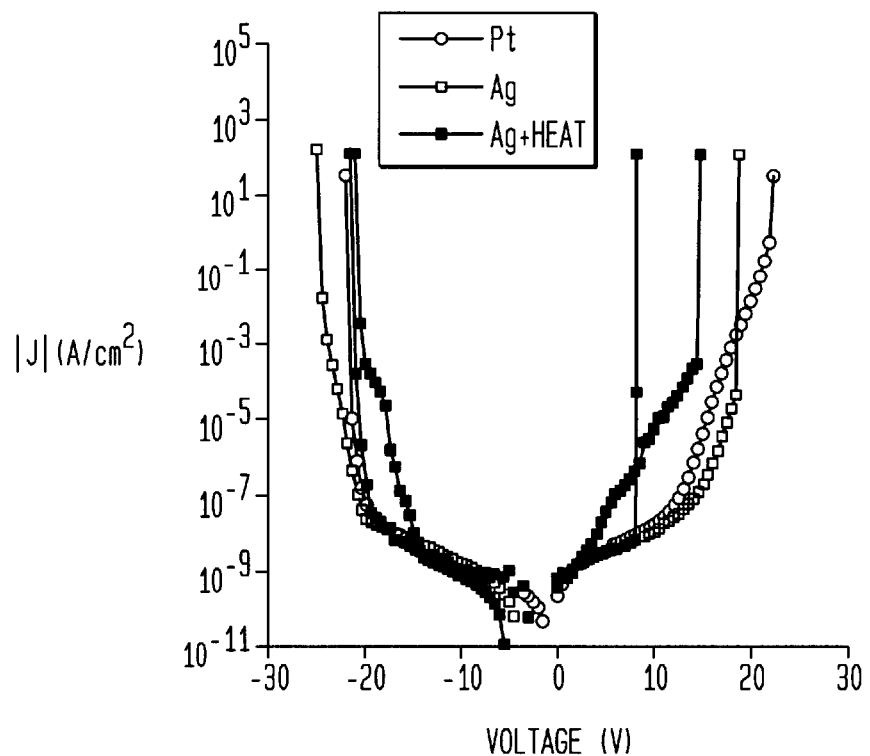
FIGS. 8a and 8b show electrical characteristics of dielectrics formed by an exemplary embodiment of the present invention.
Figure 8B:
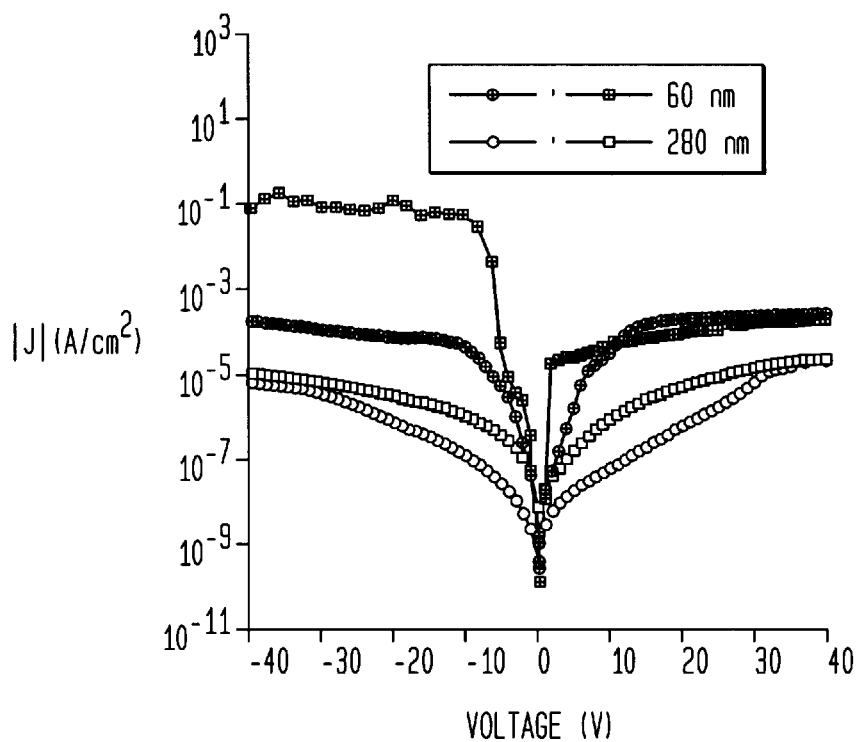

The quality of the dielectric layer was tested by measuring the electrical leakage on capacitor structures made using the base conductor (tantalum or silicon) and patterned top contacts. The top contacts were either (i) 6 nm thick platinum circles (200 μm diameter) deposited with a shadow mask in an electron beam evaporator or, (ii) 50 nm silver pads (80 μm×80 μm squares for $Ta_2O_5$, and circles ~1 mm diameter for $SiO_2$) deposited by electroless plating. The silver electroless plating conditions are described below. These electrodes were patterned by plating through a photoresist mask. The current/voltage characteristics of the capacitors were measured with an electrometer (HP-4140B, Hewlett Packard) in a constant voltage mode, with a 15 s delay after each voltage step as shown in FIGS. 8a and 8b. Leakages in both polarities were measured and voltages are plotted according to the sign on the top electrode. The capacitances of these structures were also measured using an impedance analyzer (HP-4192A, Hewlett Packard). The dielectric constant could be determined from these electrical measurements and the thicknesses evaluated by ellipsometry.

Preparation of the Source/Drain Electrode Materials

In an exemplary embodiment of the present invention, deposits of silver with thicknesses of ~50 nm were grown in ~40 s. Adequate adhesion of these films to thermally grown and anodized $SiO_2$, and to anodized $Ta_2O_5$ were observed. A commercially available plating bath (Peacock Laboratories Inc.) was used for electroless silver deposition. Solutions were prepared according to conventional procedures. Microcontact printing was used with these films to pattern the source/drain electrodes. Fabrication of the stamp for microcontact printing included performing photolithography with a chrome on quartz photomask (Advance Reproductions Corp.) and a mask aligner (MJB3-UV, Karl Suss) to pattern a film of photoresist (Shipley 1075 STR, Microlithography Chemical Corp.) on a silicon wafer (Silicon Sense Inc.). The resulting structures were placed in a dessicator for ~1 h with a few drops of tridecafluoro-1,1,2,2-tetrahydrooctyl-1-trichlorosilane (United Chemical Technologies) to silanize the native oxide in regions of the wafer that were not covered with photoresist. Casting a 10:1 mixture of polydimethylsiloxane (PDMS) prepolymer and curing agent (Sylgard 184, Dow Corning) against the wafer, and curing for ~2 h at 75° C. produced rubber stamps with features of surface relief in the geometry of the patterned resist. The stamps were inked by placing a few drops of a ~1 mM solution of hexadecanethiol (HDT) in ethanol on the surface of the stamp, and then blowing it dry with a stream of nitrogen. Bringing the stamp into contact with the silver for a few seconds produced a self-assembled monolayer (SAM) of HDT in the geometry of the relief on the stamp. An aqueous etchant (1 mM $K_4Fe(CN)_6$, 10 mM $K_3Fe(CN)_6$ and 0.1 M $Na_2S_2O_3$) removed the unprinted regions of the silver. Heating the remaining silver for ~1 h at 150° C. followed by rinsing with methanol and water removed enough of the SAM to allow electrical contact between the patterned silver source/drain electrodes and evaporated films of organic semiconductors.

Preparation of Organic Semiconductors

In an exemplary embodiment of the present invention, the organic semiconductors were deposited at a rate of 0.1–0.5 nm/s under a vacuum of ~2.0×10$^{-6}$ torr to final thicknesses of ~50 nm. The p-type semiconductor DHα5T was deposited onto substrates at approximately room temperature, while the n-type material copper hexadecafluorophthalocyanine ($F_{16}$CuPc) was deposited at a substrate temperature of ~125° C. This temperature was maintained by heating a copper block on which the substrate was mounted.

Transistor Characterization

Electrical measurements on the transistors as shown in FIGS. 7a, 7b, 9a, 9b, 10a, 10b, 11, 12a and 12b were performed using a semiconductor parameter analyzer (HP-4155A, Hewlett Packard).

Performance of n and p-Channel Transistors that Use Source/Drain Electrodes of Electroless Silver Patterned with Microcontact Printing The suitability of source/drain electrodes formed by microcontact printing on electroless silver for organic transistors was tested by constructing test structures using gate dielectrics of thermally grown $SiO_2$ (~300 nm thick) and gates of highly doped silicon. A uniform film of silver was deposited onto the oxide using commercially available plating baths. Plating for ~40 s produced films with ~50 nm thickness and good adhesion to the oxide. Performing microcontact printing with stamps of polydimethylsiloxane (PDMS) formed by casting and curing a liquid prepolymer against photolithographically patterned photoresist on a silicon wafer produced a patterned self-assembled monolayer (SAM) on the surface of the silver. The features of relief on the stamps defined the geometry of the patterned SAM. Wet chemical etching for ~30 s with an aqueous ferro/ferri cyanide etchant removed the unprinted regions of the silver film. The SAM was removed from the silver by baking the substrates at ~150° C. for ~1 h and rinsing with methanol and water. This enabled electrical contact between films of organic semiconductors and the patterned silver electrodes. Evaporation of DHα5T (~50 nm thick) and $F_{16}CuPc$ (~50 nm thick) onto these printed substrates produced bottom contact p and n-channel transistors, respectively.

Figure 6A:
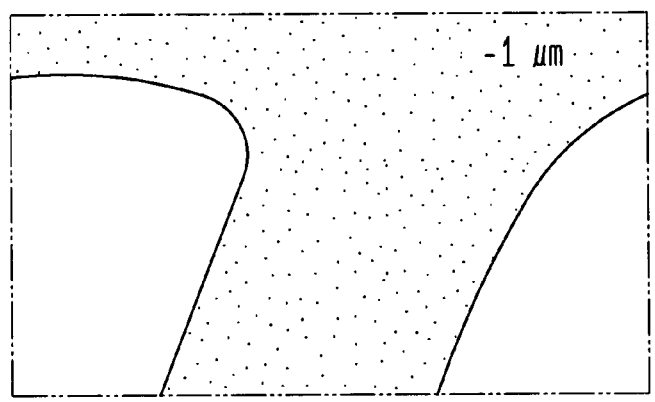
FIG. 6 shows scanning electron micrographs of source/drain electrodes of a TFT fabricated by an exemplary embodiment of the present invention.
Figure 6B:
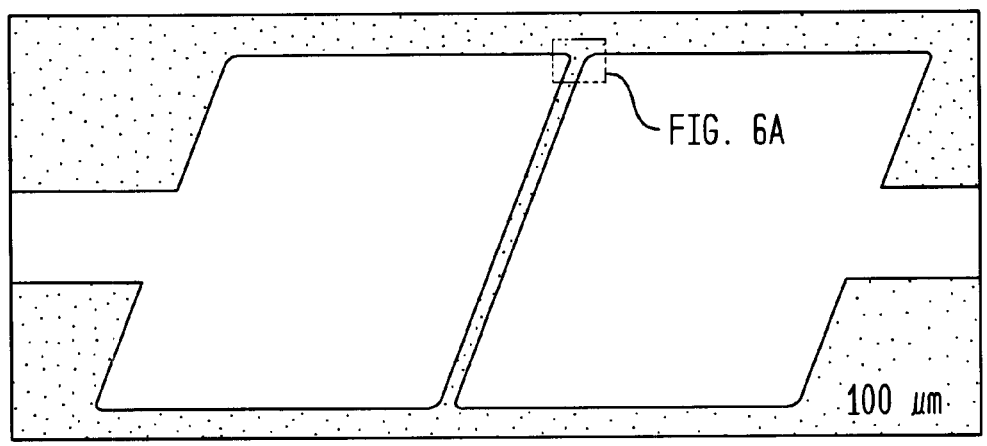

Scanning electron micrographs of printed source/drain electrodes fabricated by an exemplary embodiment of the present invention are displayed in FIG. 6. FIG. 6 illustrates scanning electron micrographs of source/drain electrodes of electroless silver (~50 nm thick) patterned with microcontact printing on $Ta_2O_5$ formed by anodizing Ta. (The images were collected with the sample tilted at ~50°.) The bottom frame shows that the edge roughness of these patterns is ~100–200 nm.

Figure 7A:
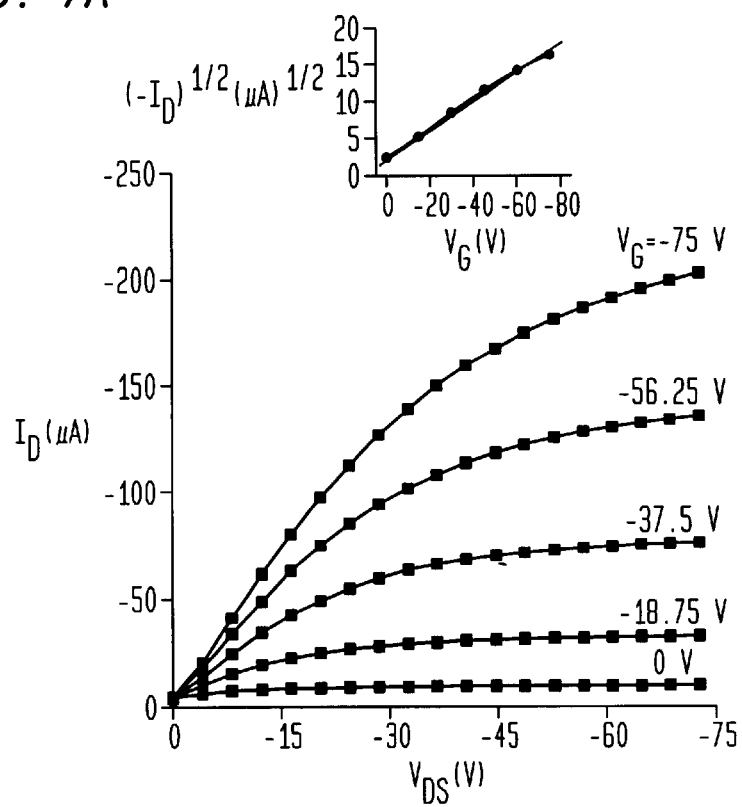
FIGS. 7a and 7b show current-voltage characteristics of p-channel and n-channel organic transistors fabricated by an exemplary embodiment of the present invention.
Figure 7B:
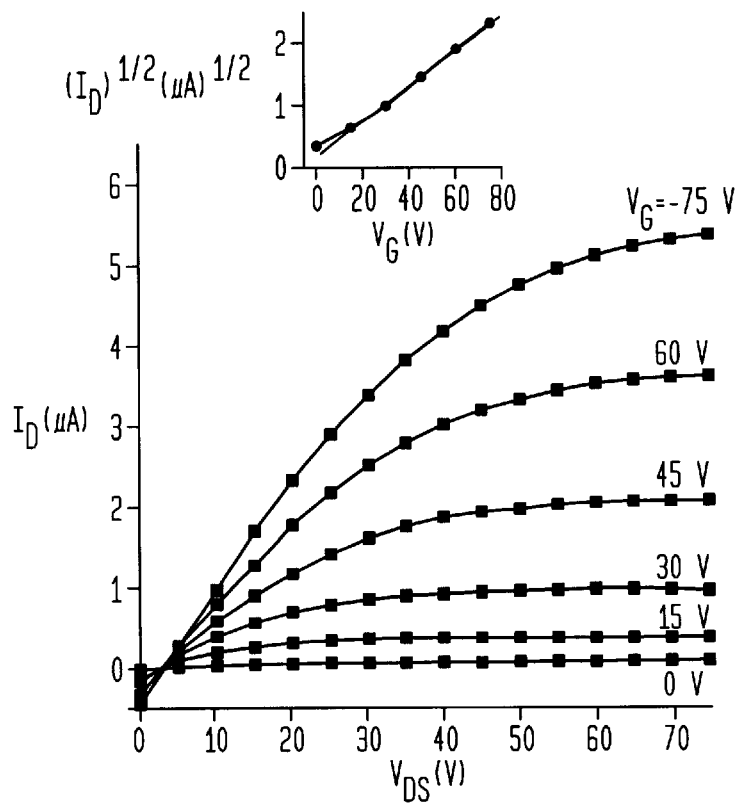

FIGS. 7a and 7b show current-voltage characteristics of p (part (a)) and n-channel (part (b)) organic transistors that use doped silicon substrates as gates, 300 nm of thermally grown $SiO_2$ as gate dielectrics, microcontact printed patterns of electroless silver (~50 nm thick) as source/drain electrodes, and semiconductors of DHα5T (~50 nm thick; p-channel; top frame) and F16CuPc (~50 nm thick; n-channel; bottom frame). Many characteristics of these devices (e.g. on/off ratios, leakage currents, saturation behavior, etc.) are comparable to benchmark devices that use shadow masked gold source/drain electrodes. The insets in the top and bottom frames show the square root of the saturation current as a function of gate voltage, and a linear fit to these data. The slopes, along with the lengths and widths of the source/drain electrodes and the capacitance of the gate dielectrics, define the mobilities of the semiconductors.

For devices that showed good characteristics, the on/off ratios, leakage, and scaling of the saturation current with gate voltage were comparable to those of transistors that used bottom contact gold (~20 nm thick) source/drain electrodes patterned using a shadow mask and an electron beam evaporator. Apparent mobilities were computed by examining the dependence of the saturation current on voltage applied to the gate, according to $$I_{DS} = \frac{WC}{2L}\mu(V_G - V_0)^2 \quad (1)$$

where $I_{DS}$ is the drain-source current in the saturation regime, W and L are the width and length of the channel respectively, C is the capacitance, $\mu$ is the mobility, $V_G$ is the gate voltage and $V_0$ is the threshold voltage. The slope of a line fit to the dependence of $(I_{DS})^{1/2}$ on $V_G$ yields the mobility. The observed mobilities of printed devices computed with equation (1) were typically lower, by a factor of 1.5–3.0 times, than those of shadow masked devices.

The transistors whose characteristics are shown in FIGS. 7a and 7b, for example, have mobilities of 0.06 and 0.0014 $cm^2/V$ s, compared to ~0.1 and ~0.003 $cm^2/V$ s for shadow masked devices that use evaporated gold. Transistors formed with electroless silver patterned by photolithography and baked at 150° C. for 1 h have mobilities as high as those observed in devices that used shadow masked gold. Also, printed devices that use electron beam evaporated silver for source/drain electrodes have edge roughnesses that are smaller and calculated mobilities that are higher than those that use electroless silver. The mobilites exhibited by organic transistors with printed electroless silver are high and sufficiently close to the largest mobilities observed in similar systems to satisfy the requirements of many applications.

Testing the Electrical Characteristics of $SiO_2$ and $Ta_2O_5$ Films Formed by Anodization Using the thickness measurements from ellipsometry, capacitance measurements on the anodized $Ta_2O_5$ consistently gave dielectric constants of 23±3, which agree with the accepted range of values for amorphous thin films of $Ta_2O_5$. The electrical leakage characteristics of a 50 nm thick anodized $Ta_2O_5$ film are shown in FIG. 8a for various top metal electrodes and processing conditions. FIGS. 8a and 8b show electrical characteristics of dielectrics formed by anodization. Parts (a) and (b) show leakage currents as a function of voltage for both anodized $Ta_2O_5$ (~50 nm) and $SiO_2$ (~60 nm and ~280 nm) dielectrics respectively. Capacitor structures were tested with Pt (○) and electroless silver (□) top contacts. $Ta_2O_5$ capacitors with heat treated (150° C. for 1 h) electroless silver top contacts (■) were also investigated.

The results are consistent with other reports for high quality $Ta_2O_5$: leakages less than $10_{-8}$ $A/cm^2$ at ±1 MV/cm (±5V) and breakdown between 4 and 5 MV/cm. The leakage currents were relatively symmetrical to bias, and both electron beam platinum and electroless silver top contacts yielded roughly equivalent values. More comprehensive studies on anodized $Ta_2O_5$ have shown that films with thicknesses greater than ~30 nm are generally symmetric, while thinner films, or films that have been heated to temperatures>225° C., tend to have higher leakage currents especially in positive bias.

To simulate the conditions used for microcontact printing, a portion of the anodized $Ta_2O_5$ sample with the patterned silver squares was dipped into the hexadecanethiol solution and heated at 150° C. for ~1 h. The leakage curves for these capacitors are also shown in FIG. 8a. While some capacitors showed nearly identical leakage currents compared to the unheated samples, others showed slightly higher leakage and lower breakdown voltages (especially in positive bias). Both types of behavior are illustrated in FIG. 8a. A larger variation in the leakage curves from square to square with the heated silver top contacts than with the unheated ones. The performance is likely to be sufficient for transistors operated at voltages less than ~5 V. Capacitance measurements on both anodized $SiO_2$ samples (i.e., 60 nm and 280 nm thick films) gave results that varied significantly with bias voltage and frequency. This behavior may be due to accumulation/depletion in the underlying silicon substrate; the large leakage currents may also affect the capacitance measurement. The leakage characteristics are shown in FIG. 8b for both platinum and silver contacts. Overall, the leakage values are much higher than those expected for high quality $SiO_2$ (~$10_{-12}$ A/cm$^2$). Although the quality of the anodized oxide was less than the $Ta_2O_5$, the leakage of even the 60 nm film was less than ~$10_{-6}$ A/cm$^2$ at ~5 V, the maximum operating voltage for organic transistors described in the following section.

Performance of n and p-Channel Organic Transistors that Use Anodized Gate Dielectrics and Source/Drain Electrodes of Electroless Silver Patterned with Microcontact Printing In an exemplary embodiment of the present invention, electroless silver electrodes are printed on anodized substrates and organic semiconductors are deposited on these structures to form working transistors. The combined use of anodization and printing with electroless silver provides an attractive, solution-based approach to fabricating two elements of organic transistors: high capacitance gate dielectrics and high resolution source/drain electrodes. Data presented in previous sections demonstrate that (i) capacitors formed using anodized tantalum and silicon substrates have leakage characteristics that make these oxides acceptable as gates/gate dielectrics for certain applications of organic transistors, (ii) these anodized materials are compatibile with electroless silver (e.g. adhesion is good, there is no significant diffusion into the dielectric of the silver or the initiator for electrochemical deposition, etc.) and (iii) transistors formed with printed source/drain electrodes of electroless silver on thermal oxide have good performance.

Devices were fabricated according to exemplary embodiments of the present invention. The thicknesses of the anodized oxides were, for example, 60 nm and 280 nm for $SiO_2$ and 60 nm and 70 nm for $Ta_2O_5$.

Figure 9A:
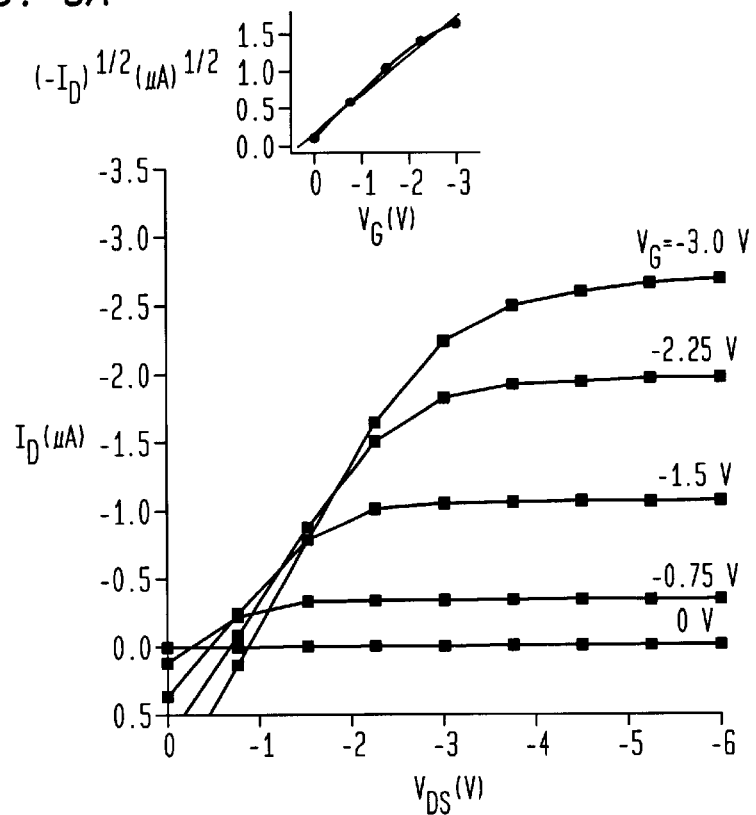
FIGS. 9a and 9b show current-voltage characteristics of p-channel organic transistors fabricated by an exemplary embodiment of the present invention.
Figure 9B:
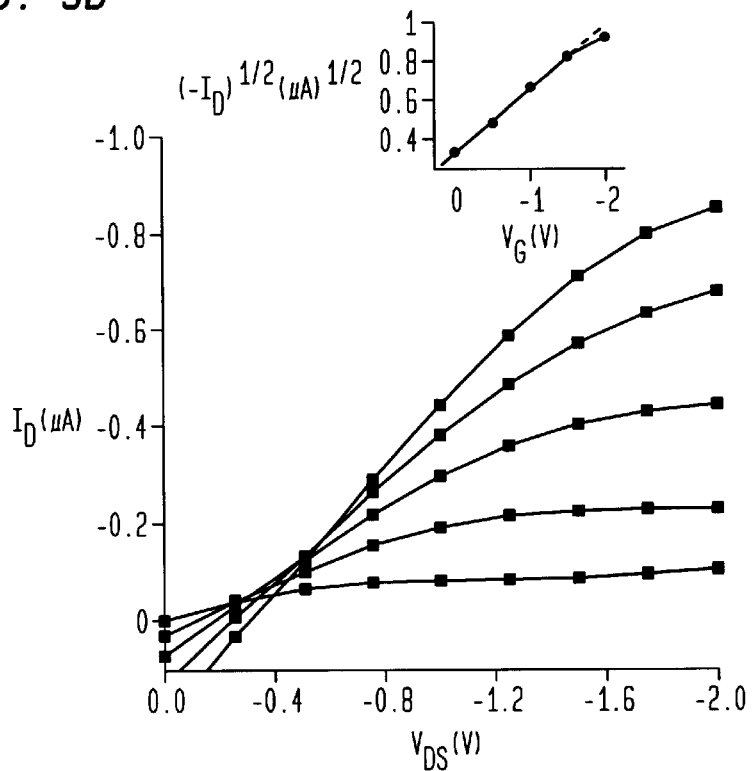
Figure 10A:
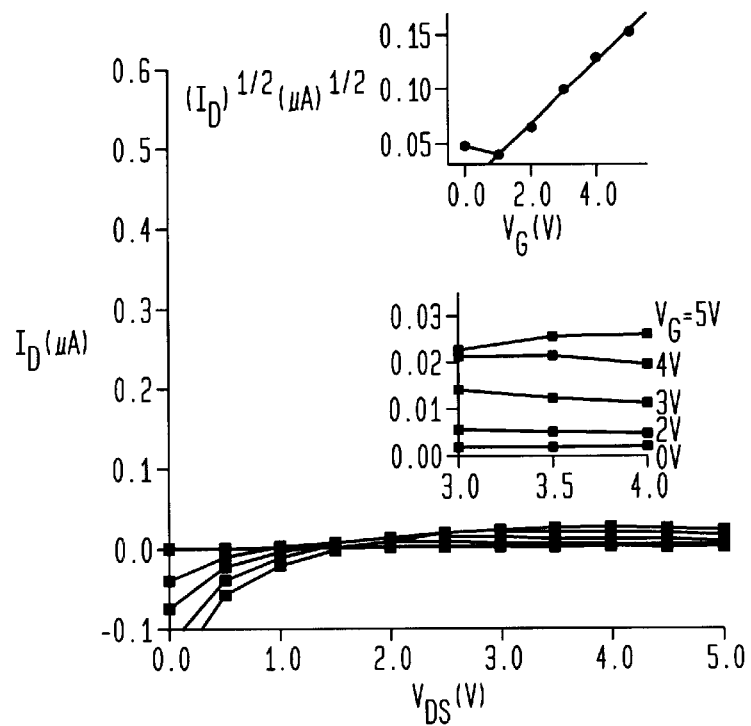
FIGS. 10a and 10b show current-voltage characteristics of n-channel organic transistors fabricated by an exemplary embodiment of the present invention.
Figure 10B:
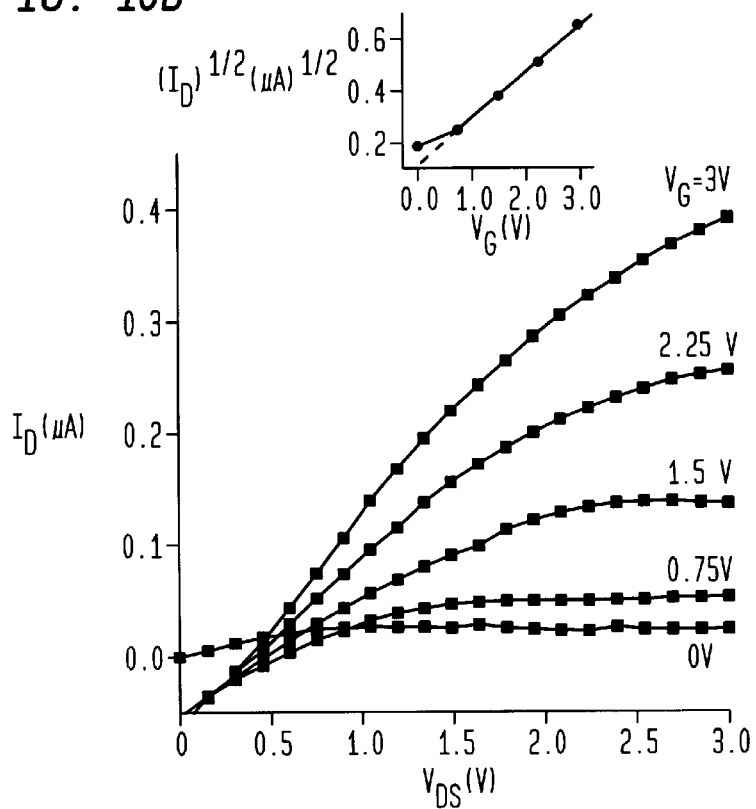

FIGS. 9a and 9b also show current-voltage characteristics of p-channel organic transistors that use the semiconductor DHα5T (thickness ~50 nm), printed source/drain electrodes of electroless silver (thickness ~50 nm) and oxide gate dielectrics formed by anodizing an underlying conductor (gate). Parts (a) and (b) show characteristics of devices formed with gate dielectrics/gates of $Ta_2O_5$ (~70 nm)/Ta (~140 nm), and $SiO_2$ (~60 nm)/Si (substrate), respectively. The insets in the top and bottom frames show the square root of the saturation current as a function of gate voltage, and a linear fit to these data. Devices with other dielectric thicknesses (i.e., with 280 nm $SiO_2$ and 60 nm $Ta_2O_5$) showed electrical behavior consistent with the characteristics illustrated in FIGS. 9a and 9b. The saturation behavior, on/off ratios and leakage currents are all comparable to those of devices that use thermally grown oxide on doped silicon. For the largest devices, the area occupied by the source and drain electrodes was ~0.025 cm$^2$. The leakage current expected to flow, at maximum gate voltage, from these pads, directly through the gate dielectric, to the gate is <0.02 nA and <2 nA for devices that use $Ta_2O_5$ and $SiO_2$, respectively. Transistors formed with the 60 nm thick layers of this material have high mobilities (>0.1 cm$^2$/Vs) at low voltages if we assume a voltage-independent dielectric constant of 3.9. The calculated mobilities for the transistors that used $Ta_2O_5$ are between 0.04 and 0.02 cm$^2$/V s. These values are slightly (1.5–3.0 times) lower than those observed with thermal oxide. FIG. 10a and lob show current-voltage characteristics of n-channel organic transistors that use the semiconductor F16CuPc (thickness ~50 nm), printed source/drain electrodes of electroless silver (thickness ~50 nm) and oxide gate dielectrics formed by anodizing an underlying conductor (gate). Parts (a) and (b) show characteristics of devices formed with gate dielectrics/gates of $Ta_2O_5$ (~70 nm)/Ta (~140 nm), and $SiO_2$ (~60 nm)/Si (substrate), respectively. The insets in the top and bottom frames show the square root of the saturation current as a function of gate voltage, and a linear fit to these data.

Figure 11:
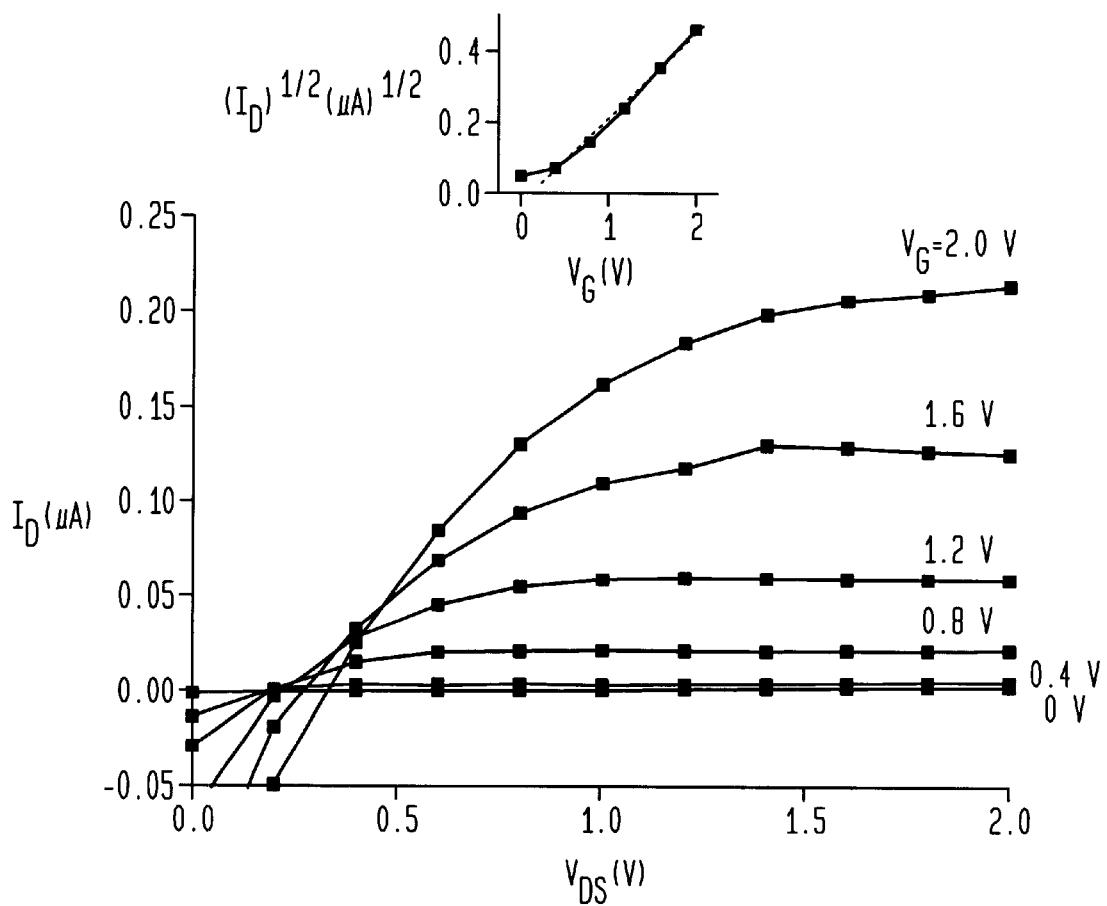
FIG. 11 shows current-voltage characteristics of an n-channel organic transistor fabricated by an exemplary embodiment of the present invention.

FIG. 11 shows typical results from a top contact device that uses ~70 nm $Ta_2O_5$ as the dielectric. The mobilities of typical devices were ~0.02 cm$^2$/Vs, consistent with previously measured values in top contact devices that use gold electrodes and dielectrics of thermally grown $SiO_2$. FIG. 11 also shows current-voltage characteristics of an n-channel organic transistor that uses the semiconductor F16CuPc (thickness ~50 nm), shadow masked top contact source/drain electrodes of silver (thickness ~50 nm) and gate dielectric/gate of $Ta_2O_5$ (~70 nm)/Ta (~140 nm). The inset shows the square root of the saturation current as a function of gate voltage, and a linear fit to these data.

Gate dielectrics 130, for example, of $SiO_2$ and $Ta_2O_5$ fabricated by anodization, with printed source/drain electrodes 140, 150 of electroless silver form organic n and p type transistors. The compatibility of these two low temperature, solution-based fabrication procedures with each other, and the compatibility of the resulting structures with organic semiconductors allow application of these methods to organic systems.

The embodiments described above are illustrative examples of the present invention and it should not be construed that the present invention is limited to these particular embodiments. Various changes and modifications may be effected by one skilled in the art without departing from the spirit or scope of the invention as defined in the appended claims.

What is claimed is:

1. A method for fabricating a thin-film transistor comprising:

preparing a gate electrode on a substrate;

anodizing at least a portion of the gate electrode to form a gate dielectric compatible with an organic semiconductor;

fabricating an electrically conducting source electrode and a drain electrode on the gate dielectric; and depositing the organic semiconductor on at least a portion of the gate dielectric, the source electrode and the drain electrode.

2. The method according to claim 1 wherein preparing the gate electrode on the substrate includes at least one of evaporating, sputter depositing, chemical vapor depositing and electrochemically growing a metal that can be anodized.

3. The method according to claim 1 wherein fabricating the electrically conducting source electrode and the drain electrode on the gate dielectric includes forming a film of metal on at least one of the gate dielectric and organic semiconductor and patterning the film.

4. A method for fabricating a thin-film transistor comprising:

preparing a gate electrode on a substrate;

anodizing at least a portion of the gate electrode to form a gate dielectric;

fabricating an electrically conducting source electrode and a drain electrode on the gate dielectric; and depositing an organic semiconductor on at least a portion of the gate dielectric, the source electrode and the drain electrode, wherein fabricating the electrically conducting source electrode and the drain electrode on the gate dielectric includes forming a film of metal on at least one of the gate dielectric and organic semiconductor and patterning the film, and the forming of the film of metal on at least one of the gate dielectric and organic semiconductor is by a solution based deposition technique.

5. A method for fabricating a thin-film transistor comprising:

preparing a gate electrode on a substrate;

anodizing at least a portion of the gate electrode to form a gate dielectric;

fabricating an electrically conducting source electrode and a drain electrode on the gate dielectric; and depositing an organic semiconductor on at least a portion of the gate dielectric, the source electrode and the drain electrode, wherein fabricating the electrically conducting source electrode and the drain electrode on the gate dielectric includes forming a film of metal on at least one of the gate dielectric and organic semiconductor and patterning the film, and the patterning of the film of metal is with microcontact printing.

6. The method according to claim 1 wherein the thin-film transistor is a thin-film field effect transistor.

7. A method for fabricating a thin-film transistor comprising:

preparing a gate electrode on a substrate;

anodizing at least a portion of the gate electrode to form a gate dielectric;

fabricating an electrically conducting source electrode and a drain electrode on the gate dielectric; and depositing an organic semiconductor on at least a portion of the gate dielectric, the source electrode and the drain electrode, wherein fabricating the electrically conducting source electrode and the drain electrode on the gate dielectric includes forming a film of metal on at least one of the gate dielectric and organic semiconductor and patterning the film, the forming of the film of metal on at least one of the gate dielectric and organic semiconductor is by a solution based deposition technique, and the solution based deposition is electroless deposition.

8. A method for fabricating a thin-film transistor comprising:

preparing a gate electrode on a substrate;

anodizing at least a portion of the gate electrode to form a gate dielectric;

fabricating an electrically conducting source electrode and a drain electrode on the gate dielectric; and depositing an organic semiconductor on at least a portion of the gate dielectric, the source electrode and the drain electrode, wherein fabricating the electrically conducting source electrode and the drain electrode on the gate dielectric includes forming a film of metal on at least one of the gate dielectric and organic semiconductor and patterning the film, and the metal is silver.

9. A method for fabricating a thin-film transistor comprising:

preparing a gate electrode on a substrate;

anodizing at least a portion of the gate electrode to form a gate dielectric;

fabricating an electrically conducting source electrode and a drain electrode on the gate dielectric; and depositing an organic semiconductor on at least a portion of the gate dielectric, the source electrode and the drain electrode, wherein fabricating the electrically conducting source electrode and the drain electrode on the gate dielectric includes forming a film of metal on at least one of the gate dielectric and organic semiconductor and patterning the film, the forming of the film of metal on at least one of the gate dielectric and organic semiconductor is by a solution based deposition technique, and wherein the metal is silver.

10. A method for fabricating a thin-film field effect transistor comprising:

preparing a gate electrode on a substrate;

anodizing at least a portion of the gate electrode to form a gate dielectric compatible with an organic semiconductor;

depositing the organic semiconductor on at least a portion of the gate dielectric; and fabricating an electrically conducting source electrode and a drain electrode on the organic semiconductor.

* * * * *